United States Patent
Singh et al.

(10) Patent No.: US 11,778,390 B2
(45) Date of Patent: Oct. 3, 2023

(54) MICROPHONE ASSEMBLY HAVING A DIRECT CURRENT BIAS CIRCUIT

(71) Applicant: Knowles Electronics, LLC, Itasca, IL (US)

(72) Inventors: Raminder Jit Singh, San Jose, CA (US); Jose Prado, Campbell, CA (US)

(73) Assignee: KNOWLES ELECTRONICS, LLC., Itasca, IL (US)

(*) Notice: Subject to any disclaimer, the term of this patent is extended or adjusted under 35 U.S.C. 154(b) by 400 days.

(21) Appl. No.: 17/091,344

(22) Filed: Nov. 6, 2020

(65) Prior Publication Data

US 2021/0144486 A1     May 13, 2021

Related U.S. Application Data

(60) Provisional application No. 62/932,091, filed on Nov. 7, 2019.

(51) Int. Cl.
| | |
|---|---|
| H04R 19/04 | (2006.01) |
| H03H 7/06 | (2006.01) |
| H04R 3/04 | (2006.01) |
| H04R 1/04 | (2006.01) |
| H02M 3/07 | (2006.01) |

(52) U.S. Cl.
CPC ............. *H04R 19/04* (2013.01); *H02M 3/07* (2013.01); *H03H 7/06* (2013.01); *H04R 1/04* (2013.01); *H04R 3/04* (2013.01); *H04R 2201/003* (2013.01)

(58) Field of Classification Search
CPC . H04R 19/04; H04R 1/04; H04R 3/04; H04R 2201/003; H04R 19/005; H04R 3/00; H02M 3/07; H03H 7/06; H03H 2210/028

USPC .......................................................... 381/98
See application file for complete search history.

(56) References Cited

U.S. PATENT DOCUMENTS

| | | |
|---|---|---|
| 7,190,038 B2 | 3/2007 | Dehe et al. |
| 7,473,572 B2 | 1/2009 | Dehe et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |

(Continued)

FOREIGN PATENT DOCUMENTS

| | | |
|---|---|---|
| CN | 101854575 A | 10/2010 |
| CN | 102684685 A | 9/2012 |

(Continued)

*Primary Examiner* — Sean H Nguyen
(74) *Attorney, Agent, or Firm* — FOLEY & LARDNER LLP (57) ABSTRACT

The disclosure describes devices and methods for starting up a microphone assembly. The device may be implemented on an integrated circuit that includes a direct current (DC) bias circuit. The DC bias circuit may be coupled to a transducer and configured to supply a DC bias signal to the transducer. The DC bias circuit includes a multi-stage charge pump and a low pass filter (LPF) circuit. The LPF circuit includes an adjustable resistance and a capacitor. A resistance of the adjustable resistance may be reduced to reduce the settling time of the LPF while starting (e.g., turning on) the microphone assembly.

21 Claims, 6 Drawing Sheets

(56) References Cited

U.S. PATENT DOCUMENTS

| | | |
|---|---|---|
| 2005/0207605 A1 | 9/2005 | Dehe et al. |
| 2007/0278501 A1 | 12/2007 | MacPherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1* | 5/2010 | Khenkin ............... H04R 19/005 381/361 |
| 2010/0183181 A1 | 7/2010 | Wang |
| 2010/0246877 A1 | 9/2010 | Wang et al. |
| 2010/0290644 A1 | 11/2010 | Wu et al. |
| 2010/0310096 A1 | 12/2010 | Josefsson et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2011/0170714 A1 | 7/2011 | Hanzlik et al. |
| 2013/0195291 A1* | 8/2013 | Josefsson ................ H02M 1/12 381/174 |

FOREIGN PATENT DOCUMENTS

| | | |
|---|---|---|
| CN | 103226368 A | 7/2013 |
| CN | 105307090 A | 2/2016 |
| CN | 107426658 A | 12/2017 |
| CN | 208079372 U | 11/2018 |
| CN | 110313184 A | 10/2019 |
| WO | WO-2018/152200 A1 | 8/2018 |

\* cited by examiner

MICROPHONE ASSEMBLY HAVING A DIRECT CURRENT BIAS CIRCUIT

CROSS-REFERENCE TO RELATED APPLICATIONS

The present application claims priority to and benefit of U.S. Provisional Application No. 62/932,091 filed Nov. 7, 2019, the disclosure of which is hereby incorporated by reference herein in its entirety.

FIELD OF THE DISCLOSURE

The present disclosure relates generally to microphone assemblies, such as, but not limited to, those with micro-electromechanical systems (MEMS) transducers.

BACKGROUND

Microphones having a transducer that convert sound into an electrical signal conditioned or processed by an integrated circuit are commonly integrated with cell phones, personal computers and IoT devices, among other host devices. Sound is converted into electrical signal with reduced noise if a direct current (DC) bias applied to the transducer is within a particular range. The DC bias may be generated and filtered by a low pass filter (LPF) after the microphone is turned on. However, a LPF may have settling time that is too long and results in an audible imperfection if the electrical signal is output to a speaker before the LPF has settled.

BRIEF DESCRIPTION OF THE DRAWINGS

The objects, features and advantages of the present disclosure will become more fully apparent from the following description and appended claims, taken in conjunction with the accompanying drawings. The drawings depict only representative embodiments and are therefore not considered to limit the scope of the disclosure, the description of which includes additional specificity and detail.

DETAILED DESCRIPTION

The present disclosure describes microphone assemblies and other devices including a DC bias circuit having a low pass filter (LPF) with an adjustable resistance connected to an input of a transducer of the microphone or other device and methods therefor. The adjustable resistance allows for a faster settling time of the DC bias circuit and thereby allows for the microphone to have a faster startup time. The devices and methods disclosed herein may be used to reduce the amount of time that it takes a microphone assembly to startup, which allows for a microphone to turn off/on with reduced audible imperfections (e.g., audible pops or clicks).

Figure 1:
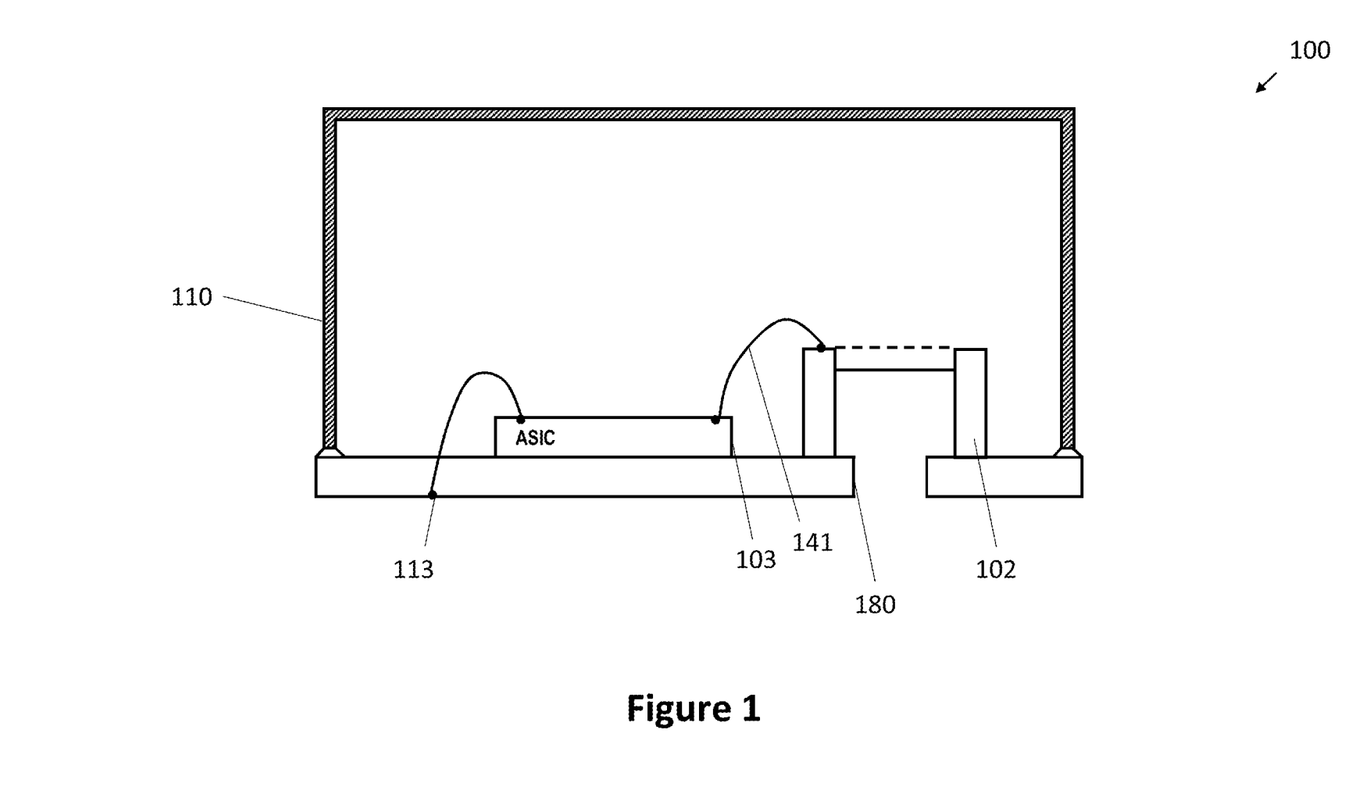
FIG. 1 is a cross-sectional view of a microphone assembly.

FIG. 1 is a cross-sectional view of a microphone assembly 100 in which a LPF with an adjustable resistance is implemented. The microphone assembly 100 generally includes an electro-acoustic transducer 102 coupled to an electric circuit 103 disposed within a housing 110. The transducer is configured to generate an electrical signal in response so sensing acoustic activity. The transducer may be a capacitive, piezoelectric or other transduction device implemented using microelectromechanical systems (MEMS) fabrication or other known or future technology. The electrical circuit may be embodied by one or more integrated circuits, for example, an application specific integrated circuit (ASIC) with analog and digital circuits and a discrete digital signal processor (DSP) that performs audio processing (e.g., keyword/command detection, noise suppression, authentication . . . ). The housing 110 may include a sound port 180 and an external device interface 113 with contacts (e.g., for power, data, ground, control, external signals etc.) to which the electrical circuit is coupled. The external device interface 113 is configured for surface or other mounting to a host device (e.g., by reflow soldering). In some embodiments, the host device may be an amplification device configured to amplify and project an audio signal using the electrical signal generated by the transducer.

In FIG. 1, the electric circuit 103 receives an electrical signal generated by the electro-acoustic transducer via connection 141. The signal from the transducer 102 can be processed into an output signal representative of the sensed acoustic activity by the electric circuit 103. The electric circuit 103 may include a signal conditioning circuit, clock circuit, a direct current (DC) bias circuit, one or more low pass filters, and a controller, examples of which are described below. In some embodiments, a DC bias is applied to a first terminal of the transducer via connection 141. In some embodiments, the signal conditioning circuit is configured to condition an electrical signal obtained from the transducer when the circuit is coupled to the transducer.

Figure 2:
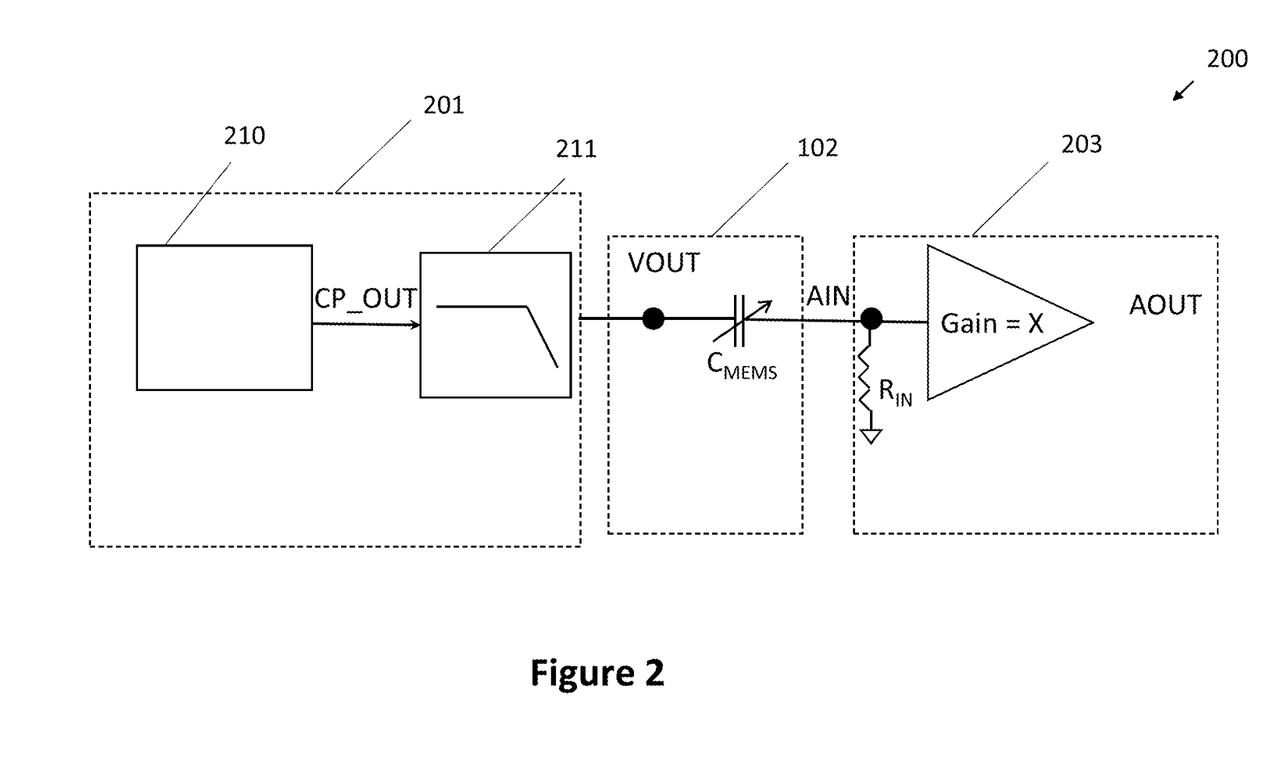
FIG. 2 is a schematic diagram of an audio circuit.

FIG. 2 is a schematic diagram of an audio circuit 200 with a LPF that includes an adjustable resistance. The audio circuit 200 generally includes a DC bias circuit 201, the transducer 102, and an amplification circuit 203. In some embodiments, DC bias circuit 201 and the amplification circuit 203 are integrated into the electric circuit 103. In some embodiments, the amplification circuit 203 may be part of the host device. In some embodiments, the amplification circuit 203 may be a signal conditioning circuit that includes a buffer, high pass filter, and/or an analog to digital converter (e.g., in digital microphones.)

In general, the DC bias circuit 201 is arranged to provide a DC bias signal to the transducer 102. In some embodiments, the DC bias circuit 201 includes a multi-stage charge pump circuit 210 and a low pass filter LPF having an adjustable resistance 211. In some embodiments, DC bias circuit 201 may include other types of DC amplifying circuits as an alternative or in addition to the multi-stage charge pump circuit 210. The multi-stage charge pump 210 is configured to convert a DC voltage to an output DC voltage that is higher in magnitude. For example, the multi-stage charge pump circuit 210 may have an input from a battery or other power source that is 3 volts and the output of the multi-stage charge pump circuit 210 may have an output that is 10 volts or higher. In some embodiments, the increase in DC voltage from the input to the output of the multi-stage charge pump circuit 210 is based on the number of charge pumps or other DC amplifying circuits within the multi-stage charge pump circuit 210. The LPF having an adjustable resistance 211 also includes a capacitor. The LPF having an adjustable resistance 211 is arranged to receive a signal from the output of the multi-stage charge pump circuit 210 and output the DC bias signal to the transducer 102.

The transducer 102 is arranged to receive the DC bias signal from the DC bias circuit 201 and to generate an electrical signal that is indicative of sensed acoustic energy. The electrical signal is generated with the DC bias signal as a reference voltage. For example, the DC bias signal may be 10 volts (V), and the electrical signal generated by the transducer 102 may be a signal within the range of a few millivolts (mV) to a few hundred millivolts (e.g., 0.001 mV-100 mV.) The electrical signal is then provided to the amplification circuit 203 (or electric circuit 103). As one example, the electrical signal may be amplified by the amplification circuit 203 and transmitted to a speaker that is configured to convert the amplified signal back into acoustic sound.

Figure 3:
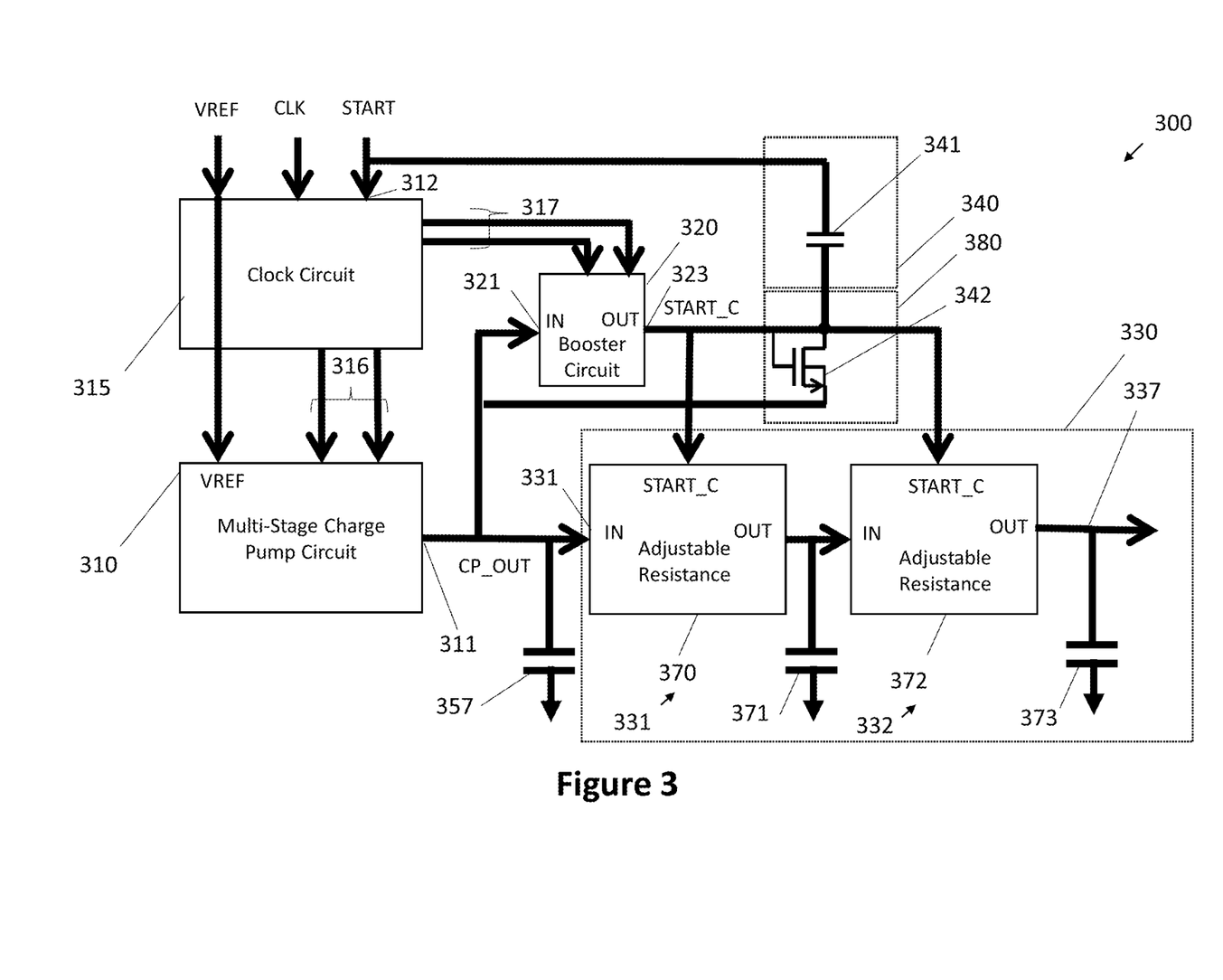
FIG. 3 is a schematic diagram a direct current (DC) bias circuit.

FIG. 3 is a schematic diagram a direct current (DC) bias circuit 300. In some embodiments, the DC bias circuit 300 may be the DC bias circuit 201 of FIG. 2. The DC bias circuit 300 includes a multi-stage charge pump circuit 310, a booster circuit 320, and a low pass filter stage 330.

The multi-stage charge pump circuit 310 may be similar to the multi-stage charge pump circuit 210 of FIG. 2. The multi-stage charge pump circuit 310 receives a reference signal $v_{ref}$ and a first two phase clock signal 316 from a clock circuit 315 and generates a DC output signal CP_OUT at an output 311. The clock circuit 315 is configured to output the first two phase clock signal 316 when the clock circuit 315 receives a clock signal CLK at a first input. The multi-stage charge pump circuit 310 amplifies the voltage of the reference signal $v_{ref}$ from a first voltage to a second voltage an output signal CP_OUT only when receiving the first two phase clock signal 316 (i.e., only when active).

The output 311 of the multi-stage charge pump circuit 310 is connected to an input 321 of the booster circuit 320 and an input 331 of the low pass filter stage 330. In some embodiments, the output 311 of the multi-stage charge pump circuit 310 may also be connected to a first terminal of a first capacitor 357. A second terminal of the first capacitor 357 may be connected to ground. As such, the output signal CP_OUT of the multi-stage charge pump 310 is input to the booster circuit 320 and the low pass filter stage 330 when the multi-stage charge pump circuit 310 is receiving the first two phase clock signal 316 and the reference signal $v_{ref}$. The booster circuit 320 is coupled to the clock circuit 315 and is configured to receive a second two phase clock signal 317 from the clock circuit 315 at a second input. The second two-phase clock signal 317 is only output by the clock circuit 315 while the clock circuit 315 is receiving the clock signal CLK and a start signal START (i.e., a control signal) at a third input 312. In some embodiments, the magnitude of the START signal is the same or within 20% of the magnitude of the reference signal $v_{ref}$. In some embodiments, the reference signal $v_{ref}$ is within 2.7-3.6 volts.

The booster circuit 320 includes an output 323 that is connected to the LPF stage 330 and, in some embodiments, a discharge circuit 340. The booster circuit 320 is configured to produce at an output 323 of the booster circuit 320 a voltage that is greater than a voltage at the input 321 of the booster circuit 320. That is, the booster circuit 320 is configured to output a signal START_C that has an increased voltage relative to the input signal CP_OUT when the booster circuit 320 is receiving the second two phase clock signal 317. In some embodiments, booster circuit 320 is designed such that the output signal START_C is greater than the input signal CP_OUT by 0.7 volts or more (e.g., a threshold voltage of a transistor above the input signal or more).

In some embodiments, the DC bias circuit 300 includes the discharge circuit 340 and a voltage clamp circuit 380. In some embodiments, the discharge circuit includes a capacitor 341 and the voltage clamp circuit 380 includes a voltage clamp transistor 342. A first terminal of the capacitor 341 is connected to the start signal START. A second terminal of the capacitor 341 is connected to the output 323 of the booster circuit 320, a gate (i.e., control terminal) of a voltage clamp transistor 342, and a first terminal of the voltage clamp transistor 342. A second terminal of the transistor 342 is coupled to the input of the booster circuit 320. The capacitor 341 is configured to cause the voltage on the second terminal to drop by a magnitude of the start signal START when the start signal START is turned off. The voltage clamp circuit 380 is configured to clamp the voltage of an output of the booster circuit 320 with a magnitude that is greater than a threshold voltage of a transistor above the input of the booster circuit 320.

The LPF stage 330 includes an input 331 coupled to the output of the multi-stage charge pump circuit 310 and an output 337 coupled to the transducer 102. The LPF stage 330 may have a first LPF circuit 331 and a second LPF circuit 332. In some embodiments, the LPF stage 330 may only have one LPF circuit. In some embodiments, the LPF stage 330 may have more than two LPF circuits. The first LPF circuit 331 includes a first adjustable resistance 370 and a first capacitor 371. In one embodiment, an input of the first adjustable resistance 370 coupled to the output of the multi-state charge pump circuit 310 and an output of the first adjustable resistance 370 is connected to a first terminal of the capacitor 371. A second terminal of the capacitor 371 may be connected to ground. A settling time of the first LPF circuit 331 may be reduced by reducing the first adjustable resistance 370 during a startup time of the multi-stage charge pump.

The second LPF circuit 332 includes a second adjustable resistance 372 and a second capacitor 373. The output of the first adjustable resistance 370 is connected to an input of the second adjustable resistance 372. An output of the second adjustable resistance 372 is connected to a first terminal of the second capacitor 373 and configured to connect to an input of the transducer 102. A second terminal of the second capacitor 393 may be connected to ground. A settling time of the second LPF circuit 332 may be reduced by reducing a resistance of the adjustable resistance during a startup time of the multi-stage charge pump.

Figure 4:
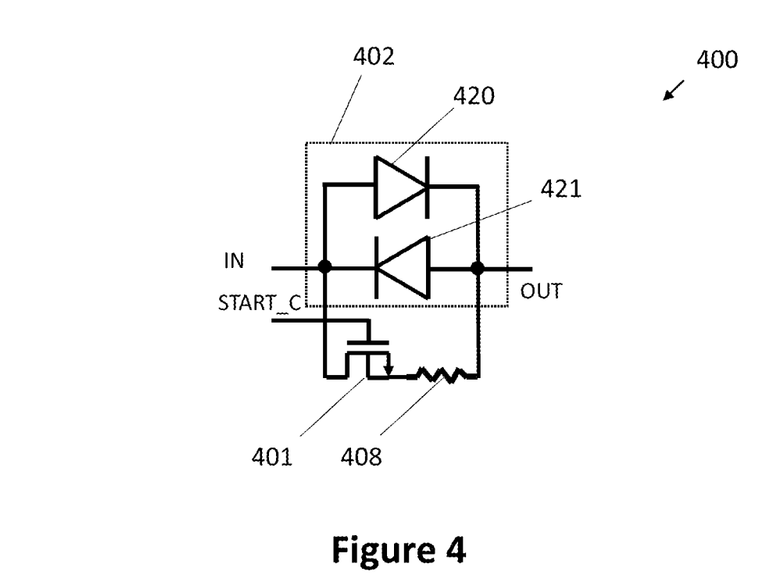
FIG. 4 is an adjustable resistance circuit.

FIG. 4 is a schematic diagram of an adjustable resistance 400. The adjustable resistance includes a transistor 401 in parallel with a resistance element 402. A resistance of the adjustable resistance 400 (and thereby of a LPF) may be reduced when the transistor is turned ON (i.e., a voltage is applied to the gate that is great enough to form a conductive channel within the transistor 401). A gate (i.e., control terminal) of the transistor 401 may be coupled to the output of the booster circuit 320. A first terminal of the transistor 401 of the first adjustable resistance 370 is coupled to the output 323 of the multi-stage charge pump 320. In this way, when the booster circuit 320 is active (i.e., turned on such that the output signal has a DC voltage larger than the input signal) the transistor 401 is also turned ON and such that the resistance of the adjustable resistance is reduced and thereby reduces a settling time of the LPF. Further, when the booster circuit 320 is not active the transistor 401 is turned OFF (i.e., there is no conductive channel in the transistor 401) and the resistance of the adjustable resistance thereby increases causing the LPF to have a lower cutoff frequency. In some embodiments, the transistor 401 may also be connected in series with one or more resistors 408. It is to be appreciated that the booster circuit 320 will have provide a DC voltage on the output that is large enough to turn on the transistor (e.g., the DC voltage on the output is greater than a threshold voltage of the transistor 401 added to the DC voltage on the input of the booster circuit 320).

In some embodiments, the resistance element 402 may include a first diode 420 and a second diode 421 where a cathode of the first diode 420 is connected to an anode of the second diode 421 and a cathode of the of the second diode 421 is connect to an anode of the first diode 420. In some embodiments, the resistance element 402 may include other elements or configurations. For example, in an embodiment, the resistance element 402 may only include one diode connected between the input and output of the adjustable resistance 400. In some embodiments, the adjustable resistance 400 may include the transistor 401 connected in series with one or more resistive elements (e.g., resistors or diodes).

Figure 5:
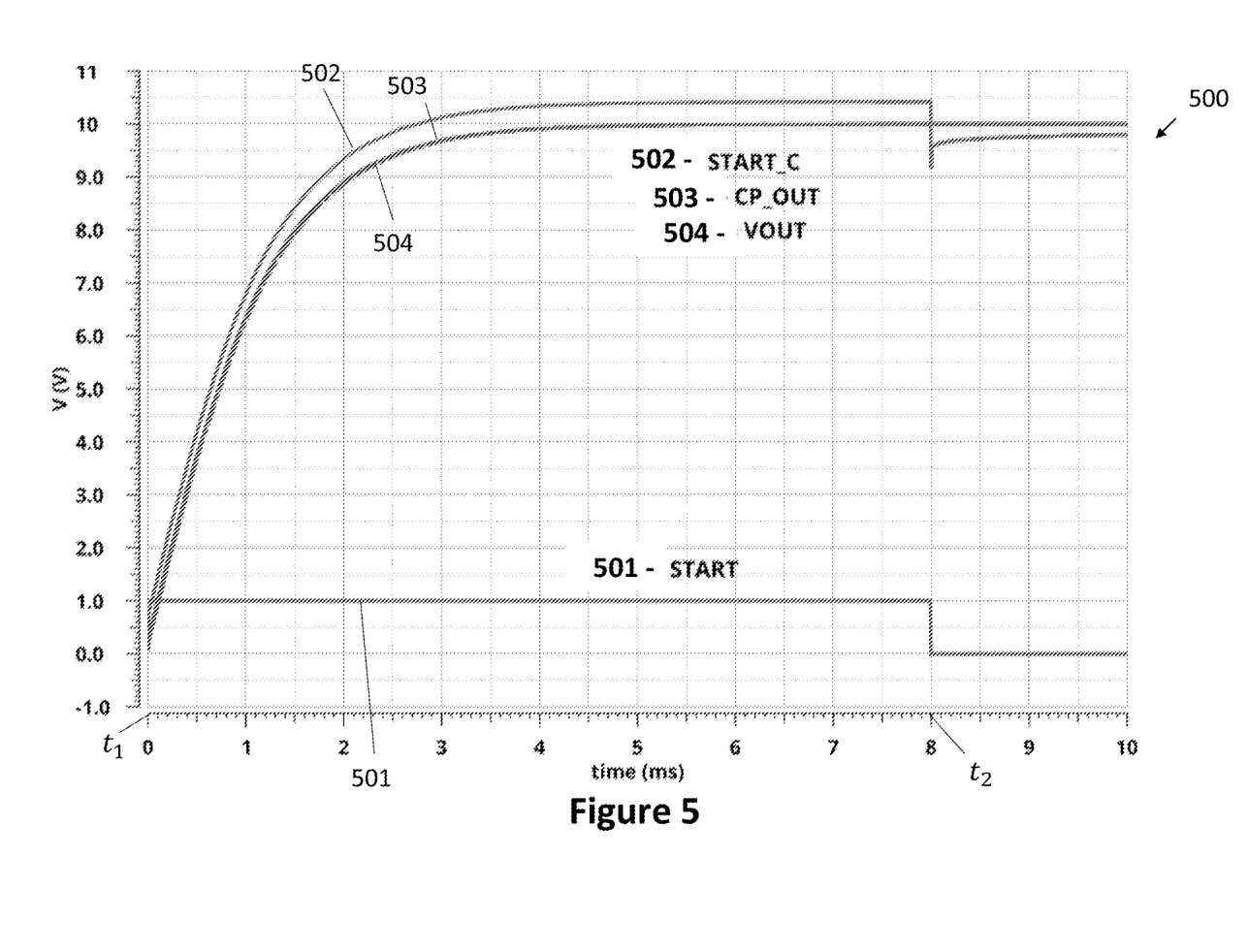
FIG. 5 is signal profile graph during a startup of an audio circuit.
Figure 6:
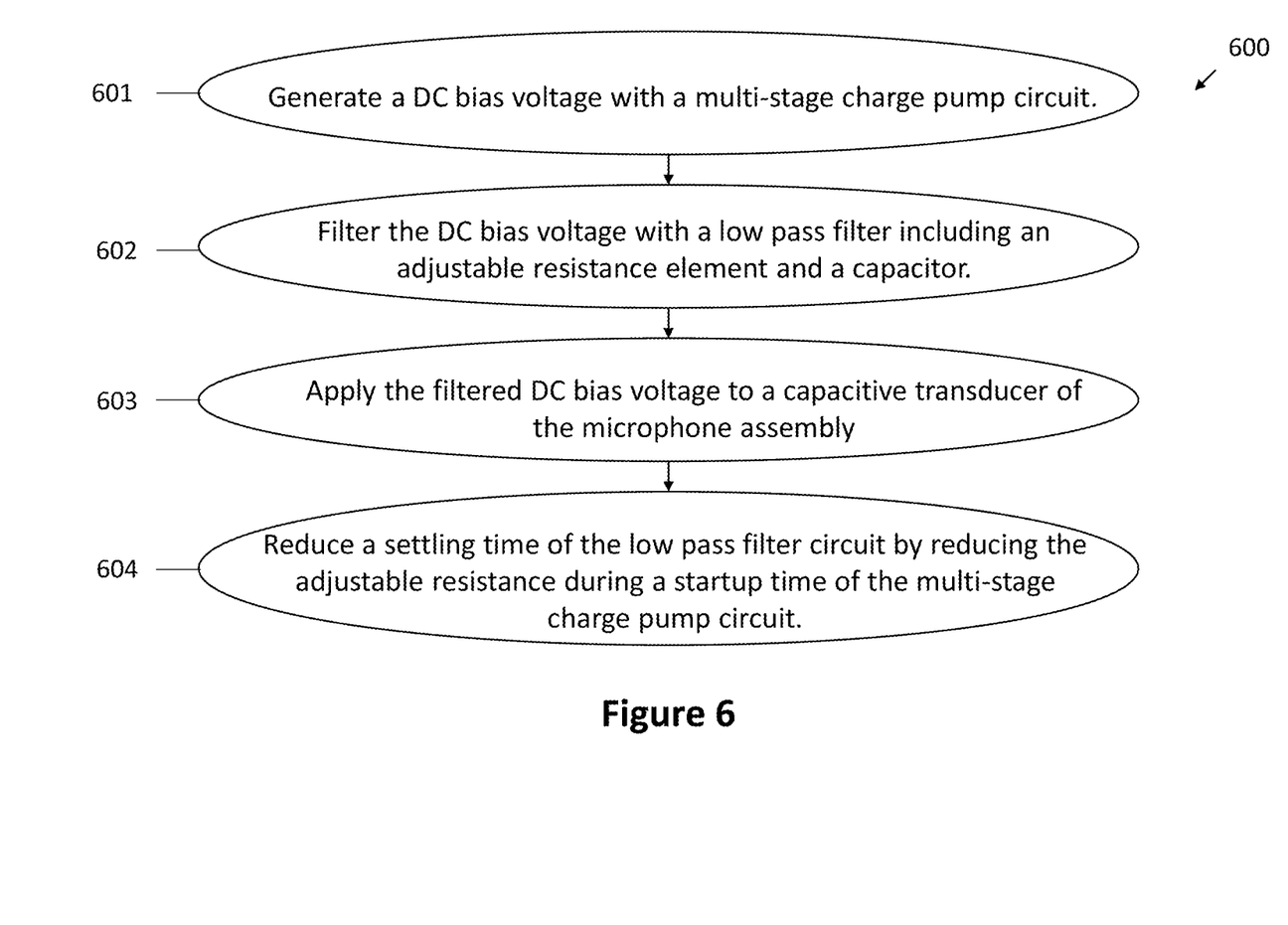
FIG. 6 is a flow diagram of a method of starting up an audio circuit.

FIG. 5 is signal profile graph 500 during a startup of an audio circuit. FIG. 6 is a flow diagram of a method 600 of starting up an audio circuit. The signal profile graph 500 includes an x-axis that denotes time and a y-axis that denotes voltage. The signal profile graph 500 depicts a start signal START (i.e., a control signal) 501, an output signal of the booster circuit START_C (e.g., shown as the line noted by reference numeral 502), and an output signal CP_OUT (e.g., shown as the line noted by reference numeral 503) of the multi-stage charge pump 320 and output signal VOUT (e.g., shown as the dashed line noted by reference numeral 504) of the LPF circuit 330. It is to be appreciated that the output signal graph VOUT 504 and the output signal CP_OUT 503 overlap or cross at various portions of the signal profile graph 500.

At a first time $t_1$, the microphone assembly is turned on or receives a signal to startup. The time between the first time $t_1$ and a second time $t_2$ where the DC bias voltage CP_OUT reaches the target DC bias voltage (e.g., 10 volts) within 50 millivolts is denoted as the startup time. During the startup time, the multi-stage charge pump is receiving an input signal (e.g., $v_{ref}$) at a first voltage and a clock signal from a clock circuit and output the output signal CP_OUT. The output signal CP_OUT is input to one or more LPF circuits and filtered, at process 602. A filtered DC bias voltage is provided to the transducer 102 at process 603.

Further, during the startup time, a settling time of the one or more LPF circuits is reduced by reducing the adjustable resistance during a startup time of the multi-stage charge pump, at process 604. That is, the START signal is applied to the DC bias circuit between the first time $t_1$ and a second time $t_2$. The START signal causes the second two-phase clock signal to be applied to the booster circuit thereby activating the booster circuit. As a result of the booster circuit being active, the output of the booster circuit START_C is at a voltage greater than the voltage of the output signal CP_OUT and the transistor of the adjustable resistance is activated thereby lowering the resistance of the adjustable resistance. The lowered resistance causes the settling time of the LPF to reduce and thereby reduced the amount of time for the output of the LPF to reach the desired DC bias voltage level. Thus, as the resistance of the LPF is reduced by turning on the transistor (e.g., switch), output signal VOUT 504 of the LPF circuit 330 reaches the input level CP_OUT 503 of the LPF circuit 330 with a reduced startup time (e.g., the microphone reaches an operation state faster).

After the startup time (e.g., after the second time $t_2$), the start signal START is turned off. As a result of the START signal being turned off, the second two-phase clock signal is turned off and the booster circuit is deactivated. As a result of the booster circuit being deactivated, the output signal START_C of the booster circuit drops below the output signal of the CP_OUT of the multi-stage charge pump 320, which causes the transistor of the adjustable resistance to turn OFF (i.e., to no longer conduct). As a result of the transistor of the adjustable resistance being turned OFF, the resistance of the adjustable resistance increases and the LPF circuit functions as a two pole LPF having a large resistance, which allows for desired filtering parameters (e.g., the cutoff frequency lower than audible frequencies) to be met.

In other words, the resistance of the adjustable resistance is reduced by turning ON the transistor of the adjustable resistance, which decreases the settling time of the LPF circuit. The transistor of the adjustable resistance is turned ON when a signal with a voltage of a sufficient magnitude is applied to the control terminal of the transistor. In some embodiments, the signal with the voltage of sufficient magnitude is supplied via the booster circuit when the booster circuit is received the second two phase clock signal. After the startup time (e.g., after the second time $t_2$) the transistor of the adjustable resistance is turned OFF by discharging the voltage applied to the control terminal of the transistor, which increases the resistance of the adjustable resistance and reduces the cutoff frequency of the LPF.

In one implementation, a digital microphone assembly includes a housing having a reflow solderable host device interface, a microelectromechanical systems (MEMS) transducer disposed in the housing and configured to generate an electrical signal responsive to acoustic activity, and an integrated circuit disposed in the housing and electrically coupled to contacts of the host device interface. The DC bias circuit includes a multi-stage charge pump circuit configured to generate a direct current (DC) voltage at an output, a low pass filter circuit having a capacitance and an adjustable resistance. The low pass filter circuit has an input coupled to the output of the multi-stage charge pump circuit, and an output coupled to the transducer. In some embodiments, the adjustable resistance including a transistor in parallel with a resistance element, where a settling time of the DC voltage applied to the transducer is reduced by turning ON the transistor during a startup time of the multi-stage charge pump circuit.

In some embodiments, the DC bias circuit includes a booster circuit, the output of the multi-stage charge pump circuit coupled to the input of the booster circuit and to a terminal of the transistor, and the output of the booster circuit coupled to a control terminal of the transistor, the booster circuit configured to produce at the output of the booster circuit a voltage that is greater than a voltage at the input of the booster circuit, where the transistor is turned ON when a voltage applied to the control terminal exceeds a threshold voltage of the transistor. In some embodiments, the DC bias circuit further includes a clock circuit having a clock signal output coupled to the booster circuit, wherein a voltage at the output of the booster circuit, sufficient to turn ON the transistor of the low pass filter, is enabled based on a state of a clock signal applied to the booster circuit. In some embodiments, the clock circuit has a control signal input, wherein a control signal applied to the clock circuit controls the state of the clock signal applied to the booster circuit.

In some embodiments, the DC bias circuit further comprising a discharge circuit including a capacitor having a terminal coupled to the output of the booster circuit, wherein the transistor of the low pass filter circuit is turned ON when the control signal is applied to the clock circuit and to another terminal of the capacitor. In some embodiments, the DC bias circuit further includes a voltage clamping circuit at the output of the booster circuit, wherein a voltage of the voltage clamping circuit is sufficient to turn ON the transistor when the output of the booster circuit is enabled. In some embodiments, the DC bias circuit further includes a voltage clamping transistor, the output of the multi-stage charge pump coupled to a first terminal of the voltage clamping transistor, and the output of the booster circuit coupled to a control terminal and a second terminal of the voltage clamping transistor, where the voltage clamping transistor provides sufficient voltage to turn ON the transistor of the low pass filter circuit when the output of the booster circuit is enabled.

In another implementation, an integrated circuit that is connectable to the transducer is disclosed. The integrated circuit including a signal conditioning circuit configured to condition an electrical signal obtained from the transducer when the circuit is coupled to the transducer and a DC bias circuit. The DC bias circuit includes a multi-stage charge pump circuit configured to generate a direct current (DC) voltage at an output and a low pass filter circuit having an adjustable resistance and a capacitance. The low pass filter circuit having an input coupled to the output of the multi-stage charge pump circuit, and an output connectable to the transducer. The settling time of the low pass filter circuit is reduced by reducing the adjustable resistance during a startup time of the multi-stage charge pump circuit.

In some embodiments, the adjustable resistance including a transistor in parallel with a resistance element, wherein the adjustable resistance of the low pass filter circuit is reduced when the transistor is ON. In some embodiments, the DC bias circuit further comprising a booster circuit, an output of the multi-stage charge pump circuit coupled to an input of the booster circuit and to a terminal of the transistor, an output of the booster circuit coupled to a control terminal of the transistor, wherein the transistor is turned ON when a voltage applied to the control terminal exceeds a threshold voltage of the transistor. In some embodiments, the DC bias circuit further comprising a clock circuit having a clock signal output coupled to the booster circuit, wherein an output of the booster circuit, sufficient to turn ON the transistor of the low pass filter circuit, is enabled based on a state of a clock signal applied to the booster circuit. In some embodiments, the clock circuit having a control signal input, wherein a control signal applied to the clock circuit controls the state of the clock signal applied to the booster circuit. In some embodiments, the transducer is a capacitive MEMs transducer.

In another implementation, a method of operating an audio circuit in a microphone assembly is disclosed. The method includes generating a DC bias voltage with a multi-stage charge pump circuit, filtering the DC bias voltage with a low pass filter including an adjustable resistance element and a capacitor, applying the filtered DC bias voltage to a capacitive transducer of the microphone assembly, and reducing a settling time of the low pass filter circuit by reducing the adjustable resistance during a startup time of the multi-stage charge pump circuit. In some embodiments, reducing the adjustable resistance by turning ON a transistor in parallel with a resistance element of the low pass filter circuit. In some embodiments, turning ON the transistor by applying a voltage to a control terminal of the transistor. In some embodiments, the method further includes after the startup time, turning OFF the transistor by discharging the voltage applied to the control terminal of the transistor.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone assembly configured for integration with a host device, the assembly comprising:
   a housing having a host device interface;
   a microelectromechanical systems (MEMS) transducer disposed in the housing and configured to generate an electrical signal responsive to acoustic activity; and
   an integrated circuit disposed in the housing and electrically coupled to contacts of the host device interface, the integrated circuit including a direct current (DC) bias circuit comprising:
   a multi-stage charge pump circuit configured to generate a DC voltage at an output;
   a booster circuit coupled to the output of the multi-stage charge pump circuit, the booster circuit configured to generate an output voltage based on the DC voltage; and
   a low pass filter circuit having a capacitance and an adjustable resistance controlled by the output voltage of the booster circuit, the low pass filter circuit having an input coupled to the output of the multi-stage charge pump circuit, and the low pass filter circuit having an output coupled to the MEMS transducer.

2. The assembly of claim 1, the adjustable resistance including a transistor in parallel with a resistance element, wherein a settling time of the DC voltage applied to the MEMS transducer is reduced by turning ON the transistor during a startup time of the multi-stage charge pump circuit.

3. The assembly of claim 2, the output of the multi-stage charge pump circuit coupled to an input of the booster circuit and to a terminal of the transistor, an output of the booster circuit coupled to a control terminal of the transistor, the booster circuit configured to produce at the output of the booster circuit the output voltage that is greater than a voltage at the input of the booster circuit, wherein the transistor is turned ON when a voltage applied to the control terminal exceeds a threshold voltage of the transistor.

4. The assembly of claim 3, the DC bias circuit further comprising a clock circuit having a clock signal output coupled to the booster circuit, wherein the output voltage at the output of the booster circuit, sufficient to turn ON the transistor of the low pass filter circuit, is enabled based on a state of a clock signal applied to the booster circuit.

5. The assembly of claim 4, the clock circuit having a control signal input, wherein a control signal applied to the control signal input controls the state of the clock signal applied to the booster circuit.

6. The assembly of claim 5, the DC bias circuit further comprising a discharge circuit including a capacitor having a terminal coupled to the output of the booster circuit, wherein the transistor of the low pass filter circuit is turned ON when the control signal is applied to the clock circuit and to another terminal of the capacitor.

7. The assembly of claim 6, the DC bias circuit further comprising a voltage clamping circuit at the output of the booster circuit, wherein a voltage of the voltage clamping circuit is sufficient to turn ON the transistor when the output of the booster circuit is enabled.

8. The assembly of claim 4, the DC bias circuit further comprising a voltage clamping transistor, the output of the multi-stage charge pump circuit coupled to a first terminal of the voltage clamping transistor, and the output of the booster circuit coupled to a control terminal and a second terminal of the voltage clamping transistor, wherein the voltage clamping transistor provides sufficient voltage to turn ON the transistor of the low pass filter circuit when the output of the booster circuit is enabled.

9. An integrated circuit connectable to a capacitive microelectromechanical systems (MEMS) transducer in a microphone assembly, the circuit comprising:
   a direct current (DC) bias circuit including:
      a multi-stage charge pump circuit configured to generate a DC voltage at an output;
      a booster circuit coupled to the output of the multi-stage charge pump circuit, the booster circuit configured to generate an output voltage based on the DC voltage; and
      a low pass filter circuit having an adjustable resistance controlled by the output voltage of the booster circuit and a capacitance, the low pass filter circuit having an input coupled to the output of the multi-stage charge pump circuit, and the low pass filter circuit having an output connectable to the MEMS transducer,
   wherein a settling time of the low pass filter circuit is reduced by reducing the adjustable resistance during a startup time of the multi-stage charge pump circuit.

10. The circuit of claim 9, the adjustable resistance including a transistor in parallel with a resistance element, wherein the adjustable resistance is reduced when the transistor is ON.

11. The circuit of claim 10, wherein an output of the multi-stage charge pump circuit is coupled to an input of the booster circuit and to a terminal of the transistor, an output of the booster circuit coupled to a control terminal of the transistor, wherein the transistor is turned ON when a voltage applied to the control terminal exceeds a threshold voltage of the transistor.

12. The circuit of claim 11, the DC bias circuit further comprising a clock circuit having a clock signal output coupled to the booster circuit, wherein a signal at the output of the booster circuit, sufficient to turn ON the transistor of the low pass filter circuit, is enabled based on a state of a clock signal applied to the booster circuit.

13. The circuit of claim 12, the clock circuit having a control signal input, wherein a control signal applied to the clock circuit controls the state of the clock signal applied to the booster circuit.

14. The circuit of claim 13, the DC bias circuit further comprising a discharge circuit including a capacitor having a terminal coupled to the output of the booster circuit, wherein the transistor of the low pass filter circuit is turned OFF when a control signal is not applied to another terminal of the capacitor and the output of the booster circuit is not enabled.

15. The circuit of claim 14, the DC bias circuit further comprising a voltage clamping circuit at the output of the booster circuit, wherein a voltage of the voltage clamping circuit is sufficient to turn ON the transistor when the output of the booster circuit is enabled.

16. The circuit of claim 12, the DC bias circuit further comprising a voltage clamping transistor, the output of the multi-stage charge pump circuit coupled to a first terminal of the voltage clamping transistor, and the output of the booster circuit coupled to a control terminal of the voltage clamping transistor, wherein the voltage clamping transistor provides sufficient voltage to turn ON the transistor of the low pass filter circuit when the output of the booster circuit is enabled.

17. The circuit of claim 9 in combination with a capacitive MEMS transducer.

18. A method of operating an audio circuit in a microphone assembly, the method comprising:
   generating a direct current (DC) bias voltage with a multi-stage charge pump circuit;
   generating an output voltage with a booster circuit based on the output of the multi-stage charge pump circuit;
   filtering the DC bias voltage with a low pass filter circuit including an adjustable resistance element and a capacitor;
   adjusting a resistance of the adjustable resistance element with the output voltage of the booster circuit applying the filtered DC bias voltage to a capacitive transducer of the microphone assembly; and
   reducing a settling time of the low pass filter circuit by reducing the resistance of the adjustable resistance element during a startup time of the multi-stage charge pump circuit.

19. The method of claim 18, reducing the resistance of the adjustable resistance element by turning ON a transistor in parallel with a resistance element of the low pass filter circuit.

20. The method of claim 19, turning ON the transistor by applying a voltage to a control terminal of the transistor.

21. The method of claim 20 further comprising, after the startup time, turning OFF the transistor by discharging the voltage applied to the control terminal of the transistor.

* * * * *